United States Patent
Chen et al.

(10) Patent No.: US 12,484,142 B2
(45) Date of Patent: Nov. 25, 2025

(54) PCB AND TERMINAL DEVICE USING SAME

(71) Applicant: HUIZHOU TCL MOBILE COMMUNICATION CO., LTD, Guangdong (CN)

(72) Inventors: Wei Chen, Guangdong (CN); Zhiwei Chen, Guangdong (CN); Pan Zhang, Guangdong (CN); Yibing Chen, Guangdong (CN)

(73) Assignee: HUIZHOU TCL MOBILE COMMUNICATION CO., LTD, Guangdong (CN)

(*) Notice: Subject to any disclaimer, the term of this patent is extended or adjusted under 35 U.S.C. 154(b) by 488 days.

(21) Appl. No.: 17/758,111

(22) PCT Filed: Feb. 20, 2020

(86) PCT No.: PCT/CN2020/076061
§ 371 (c)(1),
(2) Date: Jun. 28, 2022

(87) PCT Pub. No.: WO2021/128551
PCT Pub. Date: Jul. 1, 2021

(65) Prior Publication Data
US 2023/0027038 A1    Jan. 26, 2023

(30) Foreign Application Priority Data
Dec. 28, 2019  (CN) .......................... 201911385304.3

(51) Int. Cl.
H05K 1/02  (2006.01)
H05K 1/11  (2006.01)
H05K 1/16  (2006.01)

(52) U.S. Cl.
CPC .......... *H05K 1/0216* (2013.01); *H05K 1/025* (2013.01); *H05K 1/11* (2013.01); *H05K 1/0215* (2013.01); *H05K 1/167* (2013.01)

(58) Field of Classification Search
CPC ......... H05K 1/0216; H05K 1/11; H05K 1/025
See application file for complete search history.

(56) References Cited

U.S. PATENT DOCUMENTS

| | | | |
|---|---|---|---|
| 5,164,916 A | 11/1992 | Wu et al. | |
| 2013/0062105 A1* | 3/2013 | Howard | H05K 1/0253 174/250 |

(Continued)

FOREIGN PATENT DOCUMENTS

| | | |
|---|---|---|
| CN | 1838857 A | 9/2006 |
| CN | 1929730 A | 3/2007 |

(Continued)

OTHER PUBLICATIONS

International Search Report in International application No. PCT/CN2020/076061, mailed on Sep. 24, 2020.

(Continued)

*Primary Examiner* — Ishwarbhai B Patel
(74) *Attorney, Agent, or Firm* — PV IP PC; Wei Te Chung

(57) ABSTRACT

Disclosed in the present application are a PCB and a terminal device using the PCB. At least one electric conductor is added on an exposed section of the PCB, so that the exposed section is divided into at least two sections, thereby the problem of noise interference can be solved without extensively changing the original circuit of the PCB. In this way, the project cycle and test resource can be greatly saved, and the problem of radiation noise generated by the exposed section can be completely solved.

16 Claims, 4 Drawing Sheets

(56) References Cited

U.S. PATENT DOCUMENTS

2015/0288056 A1\* 10/2015 Choi ..................... H01Q 1/50
  343/702
2019/0021164 A1\* 1/2019 Bois ..................... H05K 9/0039

FOREIGN PATENT DOCUMENTS

| CN | 101005730 | A |   | 7/2007 |
|----|-----------|---|---|--------|
| CN | 102447760 | A |   | 5/2012 |
| CN | 106161693 | A |   | 11/2016 |
| CN | 206061272 | U |   | 3/2017 |
| CN | 117500257 | A | \* | 2/2024 |
| KR | 20070110728 | A |   | 11/2007 |

OTHER PUBLICATIONS

Written Opinion of the International Search Authority in International application No. PCT/CN2020/076061, mailed on Sep. 24, 2020.
Chinese Office Action issued in corresponding Chinese Patent Application No. 201911385304.3 dated Nov. 3, 2020, pp. 1-7.

\* cited by examiner

PCB AND TERMINAL DEVICE USING SAME

This disclosure claims priority to Chinese patent application No. "201911385304.3", filed on Dec. 28, 2019, and titled "PCB AND TERMINAL DEVICE USING SAME", which is incorporated by reference in the present application in its entirety.

TECHNICAL FIELD

The present application relates to a technical field of mobile communications, in particular to a technical field of mobile devices, and specifically to a PCB and a terminal device using the PCB.

BACKGROUND OF THE DISCLOSURE

With the continuous development of mobile terminal technology, terminal devices such as mobile phones and tablet computers have become more and more common, and the user performance requirements for terminal devices have become higher and higher. As we all know, a printed circuit board (PCB for short) is used as a carrier for carrying processors, memories, audio and video decoding chips and laying out related circuit lines and components on terminal devices, and its performance directly affects the performance of terminal devices. As the integration of terminal devices becomes higher and higher, the components of the PCB and the size, such as thickness and length, of the PCB are getting smaller and smaller, while there are more and more circuits on the PCB, so that some circuits will inevitably be set on the surface layer of the PCB. When these circuits are arranged near power lines, clock lines or high-speed data lines, they are prone to crosstalk and noise radiation due to interference signals from the power lines, clock lines or high-speed data lines. Furthermore, it will interfere with the original normal communication between the terminal device and the outside world, so that the performance of the terminal device in sending and receiving data is reduced, and the user experience will be affected.

In view of this, how to reduce noise interference has become an important research topic for relevant researchers and technicians.

BRIEF SUMMARY OF THE DISCLOSURE

Technical Problem

Embodiments of the present disclosure provide a PCB and a terminal device using the PCB. In the PCB, by adding at least one conductor to an exposed section (or called interference wire) located on the PCB, the exposed section is divided into at least two sections. Then, there is no need to change the original circuits of the PCB in a large range, and only minor changes to the exposed section can solve the problem of noise interference. Moreover, it hardly affects the impedance, performance and other indicators of the original circuits of the PCB, and there is no need to redo the PCB for re-verification. This not only greatly saves the project cycle and testing resources, but completely solves the problem of radiation noise generated by the exposed section, so that there will be no recurrence.

SOLUTIONS TO THE TECHNICAL PROBLEM

Technical Solutions

According to one aspect of the present disclosure, provided is a PCB, which comprises: a board body; a wire, having an exposed section on at least a portion of a surface of the wire; and a conductor, being provided at at least one preset position of the exposed section, two ends of the conductor are respectively electrically connected to a ground terminal of the board body, and the exposed section is divided into at least two sections; the exposed section is divided into two sections when number of the preset positions is one; the exposed section is divided into N+1 sections when number of the preset positions is N, wherein N is a natural number greater than or equal to 2; the conductor is any one of a SMD (Surface Mounted Devices) resistor, a metal sheet, and a conductive cloth.

In some embodiments of the present disclosure, the exposed section is evenly divided into N+1 sections.

In some embodiments of the present disclosure, the SMD resistor has a resistance value of zero.

In some embodiments of the present disclosure, the metal sheet is a copper sheet or a steel sheet, and the metal sheet is rectangular.

In some embodiments of the present disclosure, the conductor is arranged at a preset angle to an arrangement direction of the exposed section In some embodiments of the present disclosure, the exposed section has a radiation noise with a predetermined frequency band.

According to one aspect of the present disclosure, provided is a PCB, which comprises: a board body; a wire, having an exposed section on at least a portion of a surface of the wire; and a conductor, being provided at at least one preset position of the exposed section, two ends of the conductor are respectively electrically connected to a ground terminal of the board body, and the exposed section is divided into at least two sections.

On the basis of the above technical solutions, the present disclosure is further improved.

In some embodiments of the present disclosure, the exposed section is divided into two sections when number of the preset positions is one.

In some embodiments of the present disclosure, the exposed section is divided into N+1 sections when number of the preset positions is N, wherein N is a natural number greater than or equal to 2.

In some embodiments of the present disclosure, the exposed section is evenly divided into N+1 sections.

In some embodiments of the present disclosure, the conductor is any one of a SMD resistor, a metal sheet, and a conductive cloth.

In some embodiments of the present disclosure, the SMD resistor has a resistance value of zero.

In some embodiments of the present disclosure, the metal sheet is a copper sheet or a steel sheet, and the metal sheet is rectangular.

In some embodiments of the present disclosure, the conductor is arranged at a preset angle to an arrangement direction of the exposed section.

In some embodiments of the present disclosure, the exposed section has a radiation noise with a predetermined frequency band.

According to another aspect of the present disclosure, a terminal device using a PCB is provided, and the PCB is the above-mentioned PCB.

BENEFICIAL EFFECTS OF THE DISCLOSURE

Beneficial Effects

Compared with the prior art, the advantages of the PCB of the present disclosure lie in that, in the PCB and the terminal device using the PCB, by adding at least one conductor to an interference wire located on the PCB, the interference wire is divided into at least two sections. Then, there is no need to change the original circuits of the PCB in a large range, and only minor changes to the exposed section can solve the problem of noise interference. Moreover, it hardly affects the impedance, performance and other indicators of the original circuits of the PCB, and it does not need to redo the PCB for re-verification. This not only greatly saves the project cycle and testing resources, but completely solves the problem of radiation noise generated by the exposed section, so that there will be no recurrence.

BRIEF DESCRIPTION OF THE DRAWINGS

Description of the Drawings

The technical solutions and other beneficial effects of the present disclosure will be apparent through the detailed description of the specific embodiments of the present application in conjunction with the drawings.

Figure 1:
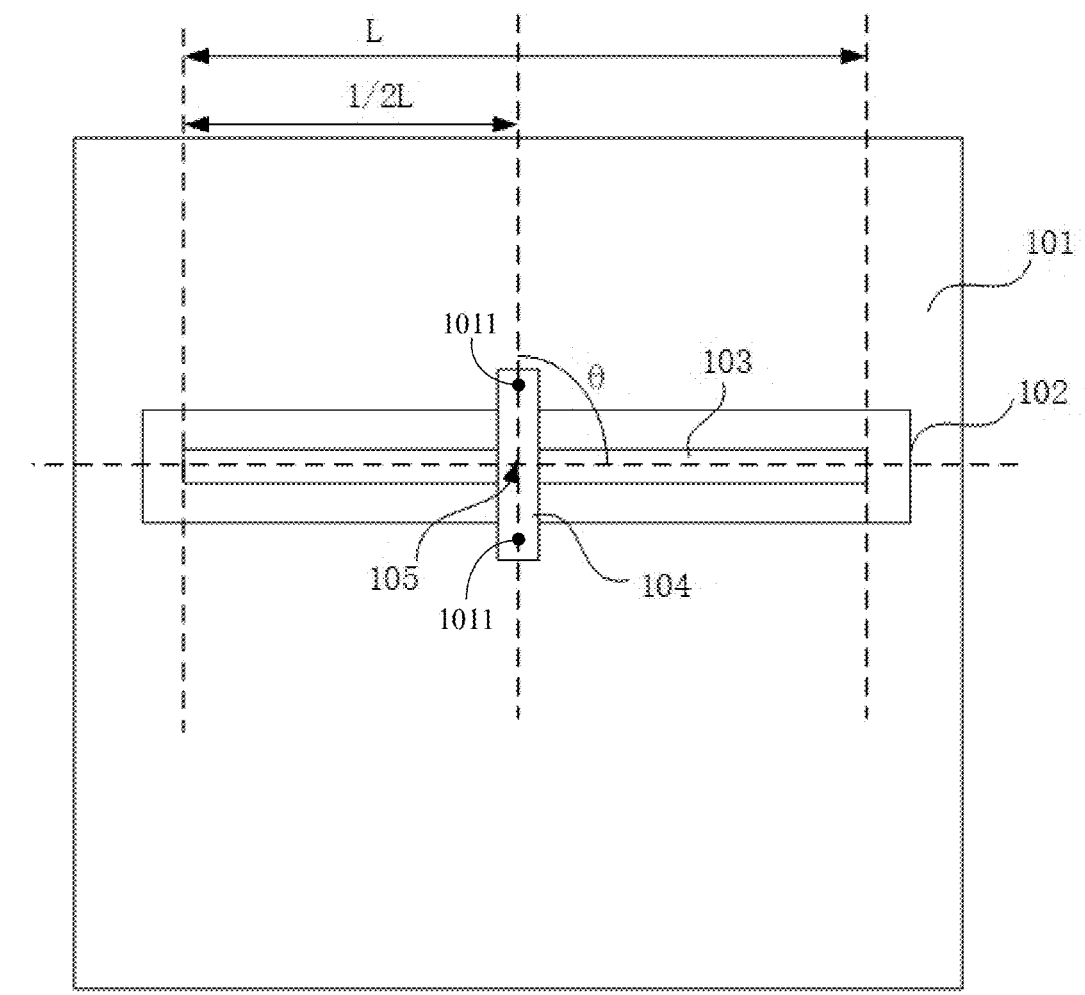

FIG. 1 is a schematic structural view of a printed circuit board (PCB) in an embodiment of the present application.

Figure 2:
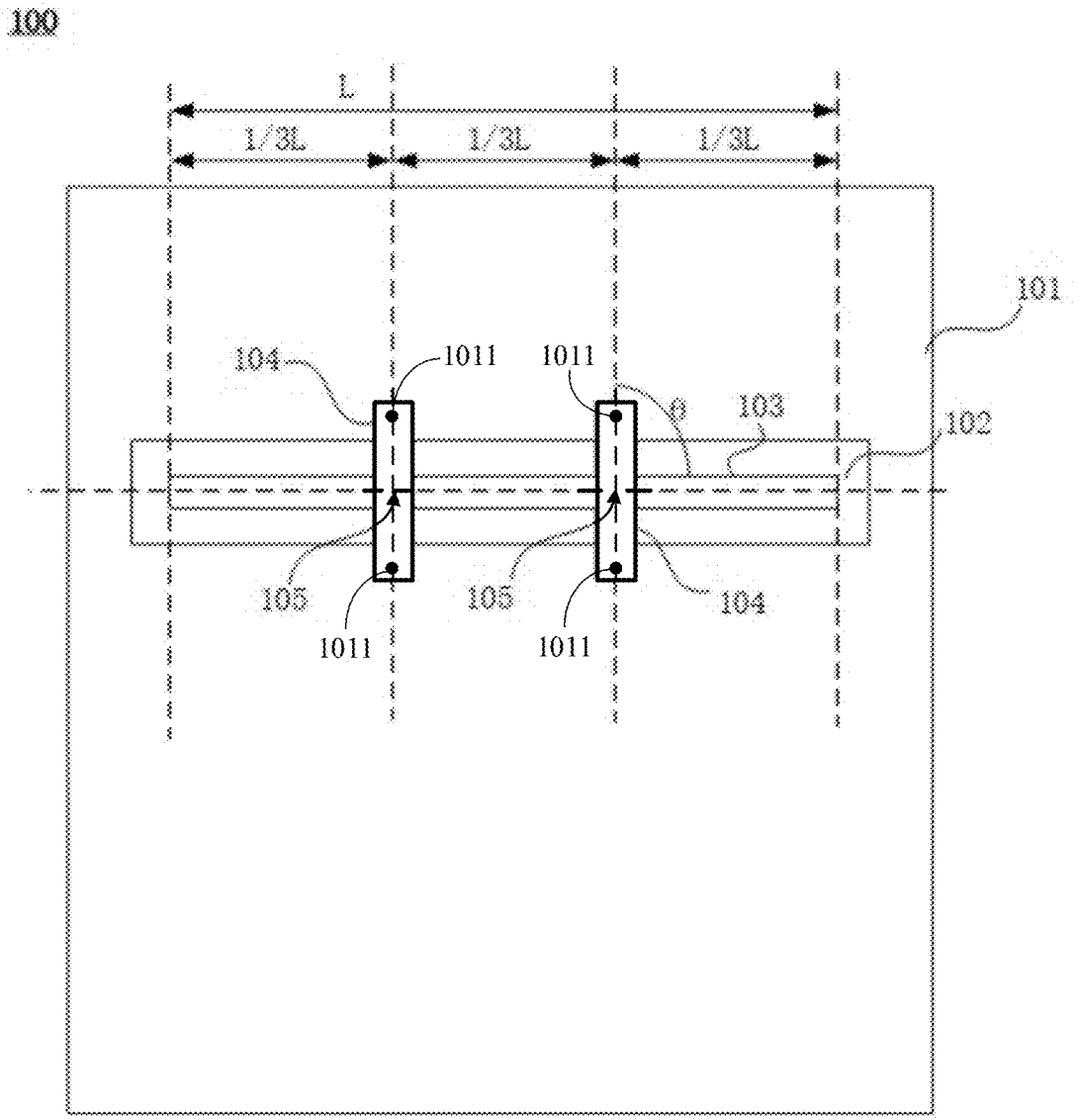

FIG. 2 is a schematic structural view of a PCB in another embodiment of the present application.

Figure 3:
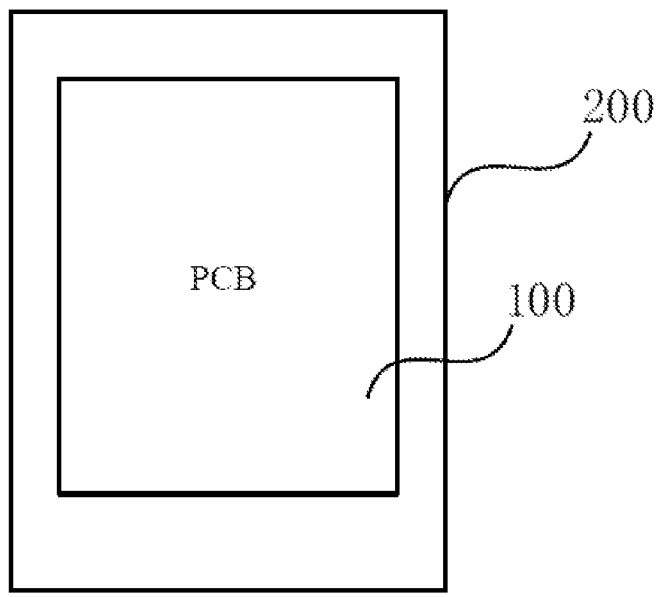

FIG. 3 is a schematic view of a terminal device using the PCB shown in FIG. 1 or FIG. 2 in the present application.

Figure 4:
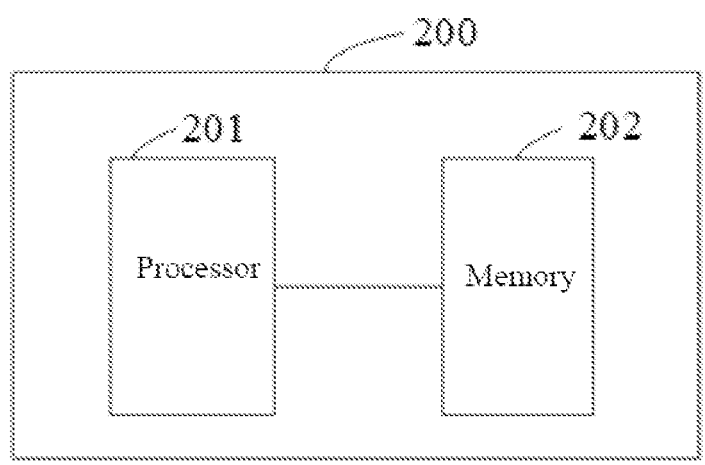

FIG. 4 is a schematic structural view of the terminal device shown in FIG. 3.

Figure 5:
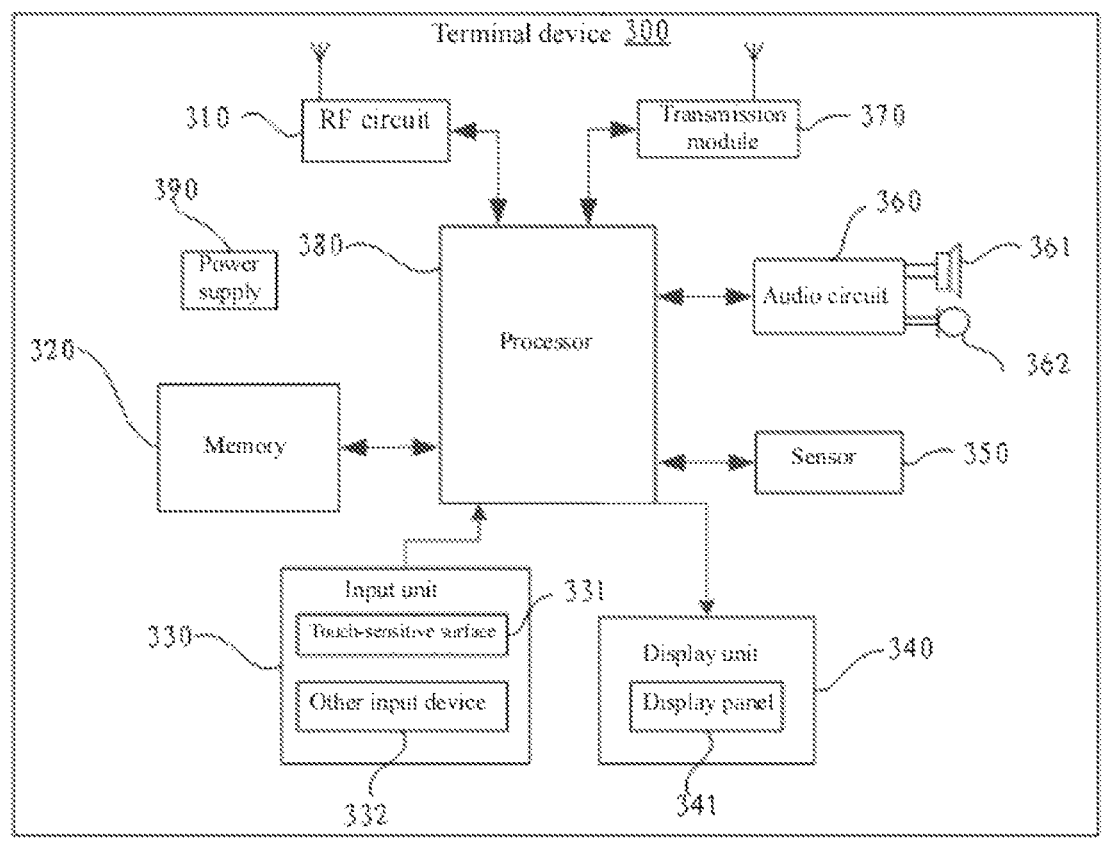

FIG. 5 is a specific structural block diagram of a terminal device according to an embodiment of the present application.

INVENTION EMBODIMENT

Embodiments of the Present Invention

Technical solutions in embodiments of the present application will be clearly and completely described below with reference to the drawings in the embodiments of the present application. Obviously, the described embodiments are only a part of the embodiments of the present application, rather than all the embodiments. Based on the embodiments in the present application, all other embodiments obtained by persons skilled in the art without creative efforts shall fall within a protection scope of the present application.

Terms "first", "second", "third", etc. (if present) in the description, claims and the above-mentioned drawings of this application are used to distinguish similar objects and are not necessarily used to describe a particular order or sequence. It is to be understood that the objects so described are interchangeable under appropriate circumstances. Furthermore, the terms "comprise" and "have", and any variations thereof, are intended to cover non-exclusive inclusion.

In the detailed description, the drawings discussed below and the embodiments used to describe the principles of the present disclosure are for illustration purposes only and should not be construed as limiting the scope of the present disclosure. Persons skilled in the art will understand that the principles of the present application may be implemented in any suitably arranged system. Exemplary embodiments will be described in detail, examples of which are illustrated in the drawings. Also, a terminal according to an exemplary embodiment will be described in detail with reference to the drawings. The same reference signs in the drawings refer to the same elements.

The terms used in this detailed description are used to describe a particular embodiment only, and they are not intended to convey the concepts of the present application. Expressions used in the singular cover expressions in the plural unless the context clearly indicates a different meaning. In the specification of the present application, it should be understood that terms such as "comprise", "have" and "contain" are intended to indicate the presence of the possibility of the features, numbers, steps, actions or combinations thereof disclosed in the present specification, it is not intended to exclude the possibility that one or more other features, numbers, steps, acts, or combinations thereof may be present or may be added. The same reference signs in the drawings refer to the same parts.

Referring to FIG. 1, the present application provides a printed circuit board (PCB 100), which comprises: a board body 101, a wiring 102 and a conductor 104.

Wherein, the board body 101 of the PCB 100 is a carrier used for carrying processors, memories, audio and video decoding chips, and laying out related circuit lines and components.

A plurality of wires 102 are arranged on the surface layer of the board body 101. Some of the wires 102 have an exposed section 103 on at least part of their surfaces.

The conductor 104 is provided at at least one preset position 105 of the exposed section 103. Two ends of the conductor 104 are respectively electrically connected to the ground terminal 1011 of the board body 101. The exposed section 103 is divided into at least two sections.

As shown in FIG. 1, in some embodiments, when the number of the preset position 105 is one, the exposed section 103 is divided into two sections.

In other embodiments, when the number of the preset positions 105 is N, the exposed section 103 is divided into N+1 sections, wherein, N is a natural number greater than or equal to 2. For example, when there are two preset positions 105, the exposed section 103 is divided into three sections, as shown in FIG. 2. When there are four preset positions 105, the exposed section 103 is divided into five sections.

Further, the exposed section 103 may be equally divided into N+1 sections. For example, when there is one preset position 105, and the preset position 105 is in the middle of the exposed section 103, the exposed section 103 may be evenly divided into two sections. At this time, the two sections of the exposed section 103 have the same length. For another example, when the number of the preset positions 105 is 4 and the preset positions 105 are equidistant, the exposed section 103 may be evenly divided into 5 sections. At this time, the lengths of the five sections of the exposed section 103 are all the same.

The conductor 104 is any one of a SMD resistor, a metal sheet, and a conductive cloth. In some embodiments of the present application, the conductor 104 adopts a SMD resistor. Further, the SMD resistor can be a zero-ohm resistor or a resistor with other resistance values. In this embodiment, a zero-ohm resistor is used because the impedance of the zero-ohm resistor is the smallest and the conduction effect is the best. In other partial embodiments, resistors with other resistance values may also be used. When the resistance of the resistor is larger, its conduction effect is relatively weak. Therefore, zero-ohm resistors are preferred.

The conductor 104 can also be a metal sheet, such as a copper sheet or a steel sheet. Since the copper sheet or the steel sheet has low cost and good electrical conductivity, the copper sheet or the steel sheet can be used as the conductors 104. The conductors 104 are rectangular, which can make the conductors 104 have good contact with the exposed section 103 on the wires 102 and improve the current carrying capacity of the exposed section 103. Of course, in other embodiments, the conductors 104 may also be in other shapes.

The arrangement direction of the conductors 104 and the arrangement direction of the exposed section 103 form a preset angle θ. For example, the preset angle θ is 90 degrees, but not limited thereto. That is, the arrangement direction of the conductors 104 and the arrangement direction of the exposed section 103 are perpendicular to each other, or they are at a certain angle. The setting of the preset angle θ depends on the process requirements of the device patch (here, the SMD resistor) and the arrangement direction of the wires 102 on the PCB 100. The device patch cannot be operated at any angle, at least at some special angles, it is difficult to operate.

In some embodiments of the present application, the exposed section 103 has a radiation noise with a preset frequency band. That is to say, noise usually has a certain bandwidth, that is, the noise exists as interference within a certain frequency range, while beyond this frequency range, the noise is severely attenuated and does not become interference. Usually the bandwidth of the noise is 10 Mhz or 20 Mhz.

When a certain wire 102 on the board body 101 of the PCB 100 has radiation noise due to the exposed segment 103, at an appropriate position in the exposed section 103 (for example, ½, ⅓, ¼ of the length of the exposed section 103), one or more conductors 104, preferably zero-impedance SMD resistors, are arranged laterally, and both ends of the resistors are connected to the ground terminals 1011 of the board body 101. This is equivalent to connecting the ground terminals 1011 on both sides of the exposed section 103 together at the position of the SMD resistor, thereby dividing the exposed section 103 into 2, 3, or 4 exposed section.

Due to the above design, the size of the exposed section 103 serving as an antenna becomes shorter, and correspondingly the radiation noise frequency also becomes higher. For example, the radiation noise frequency of the original exposed section 103 with a length of L is 2 Ghz, by adding a conductor 104, such as a zero-impedance SMD resistor, in the middle (½L) of the exposed section 103, the exposed section 103 is divided into two exposed sections with a length of ½L. Therefore, the radiation noise frequency becomes 4 Ghz, which is outside the normal communication frequency band of the terminal device (such as a mobile phone), and it does not affect the received communication of the mobile phone.

Moreover, with this design, the noise interference problem can be solved with only by making minor changes to the interference wires, without the need to change the original circuit of the PCB 100 in a large range. Furthermore, it hardly affects the impedance, performance and other indicators of the original circuit of the PCB 100, and there is no need to redo the PCB for re-verification. This not only greatly saves the project cycle and testing resources, but completely solves the noise problem caused by interfering traces, so that there will be no recurrence.

Referring to FIG. 3, according to another aspect of the present application, a terminal device 200 using a PCB 100 is provided, and the PCB is the above-mentioned PCB 100. The specific structure of the PCB 100 is the same as the above-mentioned PCB, which is not repeated here.

The terminal device 200 may be a device such as a mobile phone, a tablet, a computer, or the like. As shown in FIG. 4, the terminal device 200 may further comprise a processor 201 and a memory 202. Wherein, the processor 201 is connected to the memory 202.

The processor 201 is the control center of the terminal device 200, and it uses various interfaces and lines to connect various parts of the entire terminal device. The processor 201 executes various functions of the terminal device and processes data by running or loading the application program stored in the memory 202 and calling the data and instructions stored in the memory 202, thereby monitoring the terminal device as a whole.

In this embodiment, the terminal device 200 is provided with a plurality of storage partitions, the plurality of storage partitions comprise system partitions and target partitions, the processor 201 in the terminal device 200 loads the instructions corresponding to the processes of one or more application programs into the memory 202, and the processor 201 executes the application programs stored in the memory 202, thereby realizing various functions.

FIG. 5 shows a specific structural block diagram of a terminal device 300 provided by an embodiment of the present application, and the terminal device 300 may comprise the above-mentioned PCB. The terminal device 300 may be a mobile phone or a tablet. In addition, the terminal device may further comprise the following components.

A RF circuit 310 is used for receiving and sending electromagnetic waves, realizing mutual conversion between electromagnetic waves and electrical signals, so as to communicate with a communication network or other devices. The RF circuit 310 may comprise various existing circuit elements for performing these functions, such as, antennas, radio frequency transceivers, digital signal processors, encryption/decryption chips, Subscriber Identity Module (SIM) cards, memories, and the like. The RF circuit 310 may communicate with various networks such as the Internet, an intranet, a wireless network, or communicate with other devices over a wireless network. The aforementioned wireless network may comprise a cellular telephone network, a wireless local area network, or a metropolitan area network. The aforementioned wireless network can use various communication standards, protocols and technologies, including but not limited to the Global System for Mobile Communication (GSM), Enhanced Data GSM Environment (EDGE), Wideband Code Division Multiple Access (WCDMA), Code Division Multiple Access (CDMA), Time Division Multiple Access (TDMA), Wireless Fidelity (Wi-Fi) (e.g. Institute of Electrical and Electronics Engineers standards IEEE 802.11a, IEEE 802.11b, IEEE802.11g and/or IEEE 802.11n), Voiceover Internet Protocol (VoIP), Worldwide Interoperability for Microwave Access (WiMax), other protocols used for mail, instant messaging and short messages, and any other suitable communication protocols, even those that have not yet been developed.

A memory 320 can be used to store software programs and modules, such as the program instructions/modules corresponding to the shooting methods in the above-mentioned embodiments. A processor 380 executes various functional applications and data processing, i.e., realizes the shooting function, by running the software programs and modules stored in the memory 320. The memory 320 may comprise high-speed random memory, and may also comprise non-volatile memory, such as one or more magnetic storage devices, flash memory, or other non-volatile solid-state memory. In some examples, the memory 320 may further include memories located remotely from the processor 380, and these remote memories may be connected to the terminal device 300 through a network. Examples of such networks include, but are not limited to, the Internet, an intranet, a local area network, a mobile communication network, and combinations thereof.

An input unit 330 may be used to receive input digital or character information, and generate keyboard, mouse, joystick, optical or trackball signal input related to user settings and function control. Specifically, the input unit 330 may comprise a touch-sensitive surface 331 as well as other input devices 332. The touch-sensitive surface 331, also referred to as a touch display screen or a touchpad, may collect the user's touch operations on or near it (such as the operation of the user on or near the touch-sensitive surface 331 using any suitable object or accessory such as a finger, a stylus, etc.), and drive the corresponding connection device according to a preset program. Optionally, the touch-sensitive surface 331 may comprise two parts, a touch detection device and a touch controller. Wherein the touch detection device detects the touch orientation of the user, detects the signal brought by the touch operation, and transmits the signal to the touch controller; the touch controller receives touch information from the touch detection device, converts it into contact coordinates, and sends it to the processor 380, and can receive and execute commands sent by the processor 380. In addition, a variety of types, such as resistive, capacitive, infrared, etc., may be employed to implement the touch-sensitive surface 331. In addition to the touch-sensitive surface 331, the input unit 330 may also comprise other input devices 332. Specifically, other input devices 332 may comprise, but are not limited to, one or more of physical keyboards, function keys (such as volume control keys, switch keys, etc.), trackballs, mice, joysticks, and the like.

A display unit 340 may be used to display information input by the user or information provided to the user and various graphical user interfaces of the terminal device 300, which may be composed of graphics, text, icons, videos, and any combination thereof. The display unit 340 may include a display panel 341. Optionally, the display panel 341 may be configured in the form of an LCD (Liquid Crystal Display), an OLED (Organic Light-Emitting Diode) and the like. Further, the touch-sensitive surface 331 may cover the display panel 341. When the touch sensitive surface 331 detects a touch operation on or near it, the touch operation is transmitted to the processor 380 to determine the type of touch event, and then the processor 380 provides corresponding visual output on the display panel 341 according to the type of the touch event. Although in FIG. 5, the touch-sensitive surface 331 and the display panel 341 are used as two independent components to realize the input and output functions, in some embodiments, the touch-sensitive surface 331 may be integrated with the display panel 341 for input and output functions.

The terminal device 300 may also comprise at least one sensor 350, such as a light sensor, a motion sensor, and other sensors. Specifically, the light sensor may comprise an ambient light sensor and a proximity sensor, wherein the ambient light sensor can adjust the brightness of the display panel 341 according to the brightness of the ambient light, and the proximity sensor can turn off the display panel 341 and/or backlight when the terminal device 300 is moved to the ear. As a kind of motion sensor, the gravitational acceleration sensor can detect the magnitude of acceleration in all directions (generally three axes) and the magnitude and direction of gravity when stationary, it can be used for applications that recognize the posture of mobile phones (such as switching between horizontal and vertical screens, related games, magnetometer posture calibration), and related functions of vibration recognition (such as pedometer, tapping), etc. As for other sensors, such as a gyroscope, a barometer, a hygrometer, a thermometer, an infrared sensor, etc., that can also be configured in the terminal device 300, details are not described here.

An audio circuit 360, a speaker 361, and a microphone 362 can provide an audio interface between the users and the terminal device 300. The audio circuit 360 can transmit the electrical signal converted from the received audio data to the speaker 361, and the speaker 361 converts it into a sound signal and outputs it; on the other hand, the microphone 362 converts the collected sound signal into an electrical signal, which is received by the audio circuit 360 and converted into audio data, and then the audio data is output to the processor 380 for processing, and then sent to, for example, another terminal through the RF circuit 310, or the audio data is output to the memory 320 for further processing. The audio circuit 360 may also include an earphone jack to provide communication between the peripheral earphone and the terminal device 300.

The terminal device 300 can help users to receive and send emails, browse web pages and access streaming media, etc. through a transmission module 370 (e.g., a WIFI module), which provides users with wireless broadband Internet access. It can be understood that, although FIG. 5 shows the transmission module 370, it does not belong to the necessary structure of the terminal device 300, and it can be completely omitted as required within the scope of not changing the essence of the application.

The processor 380 is the control center of the terminal device 300, and it uses various interfaces and lines to connect various parts of the entire mobile phone. The processor 380 executes various functions of the terminal device 300 and processes data by running or executing the software programs and/or modules stored in the memory 320 and calling the data stored in the memory 320, thereby monitoring the mobile phone as a whole. Optionally, the processor 380 may include one or more processing cores; in some embodiments, the processor 380 may integrate an application processor and a modem processor, wherein, the application processor mainly handles the operating system, user interface and application programs, etc., and the modem processor mainly handles wireless communication. It can be understood that, the above-mentioned modem processor may not be integrated into the processor 380.

The terminal device 300 also comprises a power supply 390 (such as a battery) for powering various components. In some embodiments, the power supply can be logically connected to the processor 380 through a power management system, so that functions such as managing charging and discharging, and power consumption management are implemented through the power management system. The power supply 390 may also comprise one or more DC or AC power supplies, recharging systems, power failure detection circuits, power converters or inverters, power status indicators, and any other components.

Although not shown, the terminal device 300 may further comprise a camera (e.g., a front camera, a rear camera), a Bluetooth module, and the like, which will not be repeated here. Specifically, in this embodiment, the display unit of the terminal device is a touch screen display, and the terminal device further includes a memory and one or more programs, wherein one or more of the programs are stored in memory and configured to be executed by one or more processors.

During specific implementation, the above modules can be implemented as independent entities, or can be arbitrarily combined to be implemented as the same or several entities.

The specific implementation of the above modules can refer to the previous embodiments, which will not be repeated here.

A PCB and a terminal device using the PCB provided by the embodiments of the present application have been introduced in detail above. The principles and implementations of the present application are described with specific examples herein. The descriptions of the above embodiments are only used to help understand the method of the present application and its core idea; Meanwhile, for those skilled in the art, according to the idea of the present application, there will be changes in the specific embodiments and the scope of application, in conclusion, the content of this specification should not be construed as a limitation on the present application.

What is claimed is:

1. A Printed Circuit Board (PCB), comprising:
   a board body;
   a wire, having an exposed section on at least a portion of a surface of the wire; and
   a conductor, being provided at at least one preset position of the exposed section, two ends of the conductor are respectively electrically connected to a ground terminal of the board body, and the exposed section is divided into at least two sections;
   the exposed section is divided into N+1 sections when number of the preset positions is N, wherein N is a natural number greater than or equal to 1;
   the conductor is any one of a SMD resistor, a metal sheet, and a conductive cloth.

2. The PCB according to claim 1, wherein the exposed section is evenly divided into N+1 sections.

3. The PCB according to claim 1, wherein the SMD resistor has a resistance value of zero.

4. The PCB according to claim 1, wherein the metal sheet is a copper sheet or a steel sheet, and the metal sheet is rectangular.

5. The PCB according to claim 1, wherein the conductor is arranged at a preset angle to an arrangement direction of the exposed section.

6. The PCB according to claim 1, wherein the exposed section has a radiation noise with a predetermined frequency band.

7. A Printed Circuit Board (PCB), comprising
   a board body;
   a wire, having an exposed section on at least a portion of a surface of the wire; and
   a conductor, being provided at at least one preset position of the exposed section, two ends of the conductor are respectively electrically connected to a ground terminal of the board body, and the exposed section is divided into at least two sections.

8. The PCB according to claim 7, wherein the exposed section is divided into two sections when number of the preset positions is one.

9. The PCB according to claim 7, wherein the exposed section is divided into N+1 sections when number of the preset positions is N, wherein N is a natural number greater than or equal to 2.

10. The PCB according to claim 9, wherein the exposed section is evenly divided into N+1 sections.

11. The PCB according to claim 7, wherein the conductor is any one of a SMD resistor, a metal sheet, and a conductive cloth.

12. The PCB according to claim 11, wherein the SMD resistor has a resistance value of zero.

13. The PCB according to claim 11, wherein the metal sheet is a copper sheet or a steel sheet, and the metal sheet is rectangular.

14. The PCB according to claim 7, wherein the conductor is arranged at a preset angle to an arrangement direction of the exposed section.

15. The PCB according to claim 7, wherein the exposed section has a radiation noise with a predetermined frequency band.

16. A terminal device using a PCB, wherein the PCB is the PCB claimed in claim 7.

* * * * *